(12) United States Patent
Park et al.

(10) Patent No.: US 8,785,319 B2
(45) Date of Patent: Jul. 22, 2014

(54) METHODS FOR FORMING FINE PATTERNS OF A SEMICONDUCTOR DEVICE

(71) Applicant: Samsung Electronics Co., Ltd., Suwon-Si (KR)

(72) Inventors: Joon-Soo Park, Seongnam-si (KR); Kukhan Yoon, Hwaseong-si (KR); Joon Kim, Seoul (KR); Cheolhong Kim, Youngin-si (KR); Seokwoo Nam, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/799,125

(22) Filed: Mar. 13, 2013

(65) Prior Publication Data

US 2013/0260559 A1  Oct. 3, 2013

(30) Foreign Application Priority Data

Mar. 28, 2012 (KR) .................. 10-2012-0031872

(51) Int. Cl.
*H01L 21/4763* (2006.01)
(52) U.S. Cl.
USPC ............ 438/618; 438/622; 438/623; 438/624
(58) Field of Classification Search
None
See application file for complete search history.

(56) References Cited

U.S. PATENT DOCUMENTS

| 5,702,968 | A | 12/1997 | Chen |
| 6,835,666 | B2 * | 12/2004 | Popp ............................ 438/735 |
| 7,145,195 | B2 | 12/2006 | Park et al. |
| 7,205,241 | B2 | 4/2007 | Park et al. |
| 7,321,146 | B2 | 1/2008 | Yun et al. |
| 7,339,211 | B2 | 3/2008 | Kim et al. |
| 7,618,860 | B2 | 11/2009 | Lee |
| 8,435,876 | B2 * | 5/2013 | Park et al. ..................... 438/586 |
| 2003/0089987 | A1 * | 5/2003 | Parikh ........................... 257/758 |
| 2007/0241380 | A1 | 10/2007 | Hasunuma |

FOREIGN PATENT DOCUMENTS

| JP | 2000269460 A | 9/2000 |
| KR | 102009010515 A | 10/2009 |
| KR | 1020100008940 A | 1/2010 |
| KR | 1020100102422 A | 9/2010 |
| KR | 1020100134418 A | 12/2010 |
| KR | 1020110001693 A | 1/2011 |
| KR | 1020110001722 A | 1/2011 |
| KR | 1020110077687 A | 7/2011 |

* cited by examiner

*Primary Examiner* — Duy Deo
(74) *Attorney, Agent, or Firm* — Harness, Dickey & Pierce

(57) ABSTRACT

Methods of forming fine patterns are provided. The methods may include forming first hard mask patterns extending in a first direction on a lower layer, forming second hard mask patterns filling gap regions between the first hard mask patterns, forming first mask patterns extending in a second direction perpendicular to the first direction on the first and second hard mask patterns, etching the first hard mask patterns using the first mask patterns as etch masks to form first openings, forming second mask patterns filling the first openings and extending in the second direction, and etching the second hard mask patterns using the second mask patterns as etch masks to form second openings spaced apart from the first openings in a diagonal direction with respect to the first direction.

20 Claims, 15 Drawing Sheets

METHODS FOR FORMING FINE PATTERNS OF A SEMICONDUCTOR DEVICE

CROSS-REFERENCE TO RELATED APPLICATIONS

This U.S. non-provisional patent application claims priority under 35 U.S.C. §119 to Korean Patent Application No. 10-2012-0031872, filed on Mar. 28, 2012, the entirety of which is incorporated by reference herein.

BACKGROUND

Example embodiments of inventive concepts relate to methods of forming fine patterns of a semiconductor device and, more particularly, to methods of forming fine patterns arranged in zigzag form.

Forming fine patterns is beneficial when manufacturing a highly integrated semiconductor device. The size of elements in the semiconductor device becomes as small as possible to integrate many elements in a narrow area. To achieve this, a pitch corresponding to a sum of a width of the pattern and a space between the patterns is reduced. Recently, as a design rule of the semiconductor device has rapidly reduced, it may be difficult to form patterns having a fine pitch due to a resolution limitation of a photolithography process used to form the fine patterns that are beneficial when manufacturing the semiconductor device.

SUMMARY

Example embodiments of inventive concepts may provide methods of manufacturing highly integrated fine patterns.

In one aspect, a method of forming fine patterns may include: forming first hard mask patterns extending in a first direction on a lower layer; forming second hard mask patterns filling gap regions between the first hard mask patterns; forming a first mask patterns extending in a second direction perpendicular to the first direction on the first hard mask patterns and the second hard mask patterns; etching the first hard mask patterns using the first mask patterns as etch masks to form first openings; forming second mask patterns filling the first openings and extending in the second direction; and etching the second hard mask patterns using the second mask patterns as etch masks to form second openings spaced apart from the first openings in a diagonal direction with respect to the first direction.

In another aspect, a method of forming fine patterns may include: forming first hard mask patterns extending in a first direction on a lower layer; forming second hard mask patterns filling gap regions between the first hard mask patterns; forming first openings in each of the first hard mask patterns, a space between the first openings arranged in the first direction greater than a space between the first openings arranged in a second direction perpendicular to the first direction; forming second openings in each of the second hard mask patterns, the second openings spaced apart from the first openings in a diagonal direction with respect to the first direction; and transferring the first and second openings to the lower layer to form holes arranged in zigzag form.

BRIEF DESCRIPTION OF THE DRAWINGS

Example embodiments of inventive concepts will become more apparent in view of the attached drawings and accompanying detailed description.

DETAILED DESCRIPTION OF EXAMPLE EMBODIMENTS

Figure 1:
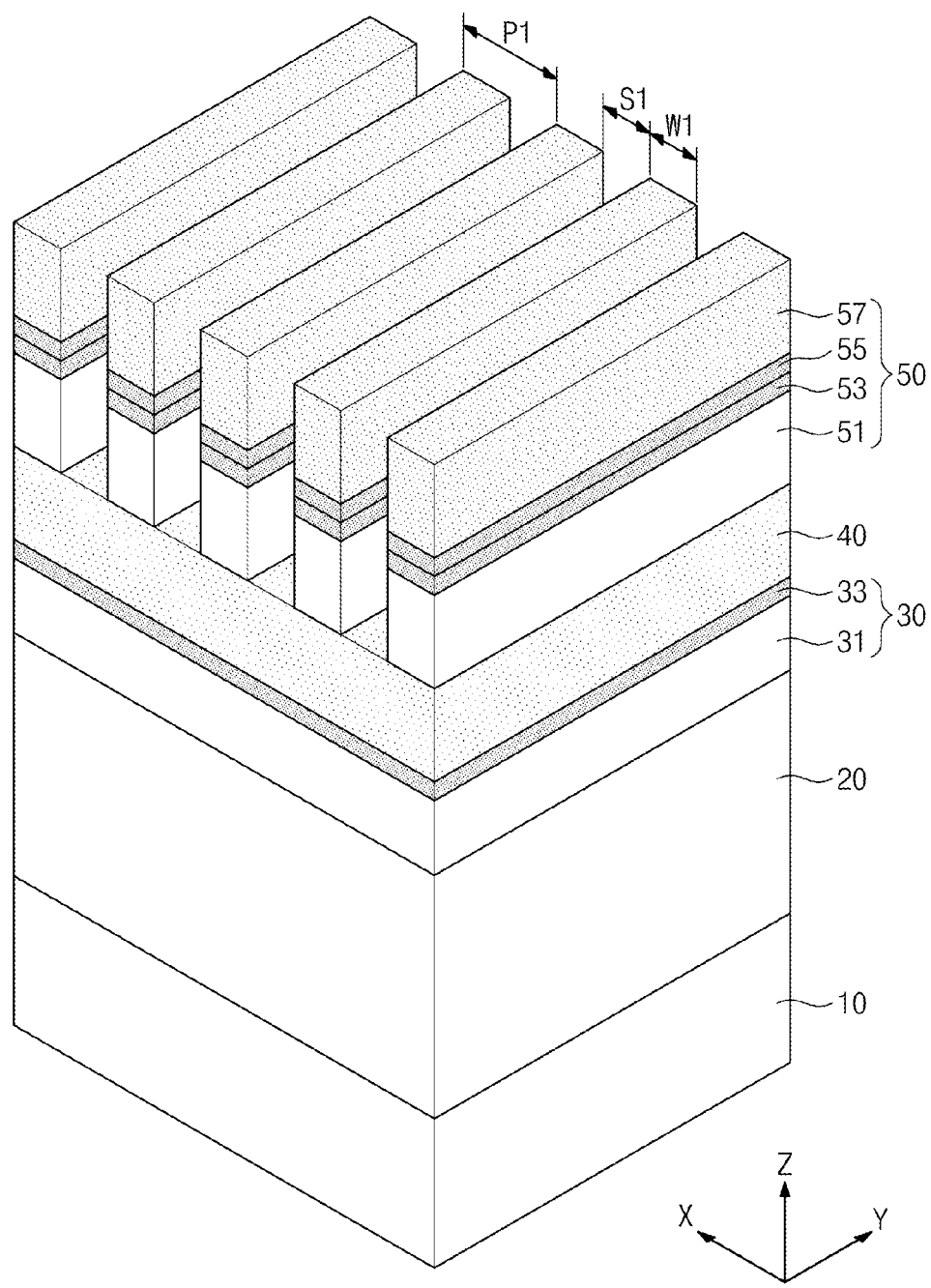
FIGS. 1 to 10 are perspective views illustrating a method of forming fine patterns according to some example embodiments of inventive concepts.

Example embodiments of inventive concepts will now be described more fully hereinafter with reference to the accompanying drawings, in which some example embodiments are shown. The advantages and features of the example embodiments and methods of achieving them will be apparent from the following example embodiments that will be described in more detail with reference to the accompanying drawings. It should be noted, however, that example embodiments of inventive concepts are not limited to the following example embodiments, and may be implemented in various forms. Accordingly, the example embodiments are provided only to disclose some example embodiments of inventive concepts and let those skilled in the art know the category of the example embodiments of inventive concepts. In the drawings, example embodiments of inventive concepts are not limited to the specific examples provided herein and are exaggerated for clarity.

The terminology used herein is for the purpose of describing particular example embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the example embodiments in the detailed description will be described with sectional views as example embodiments of inventive concepts. Accordingly, shapes of the example views may be modified according to manufacturing techniques and/or allowable errors. Therefore, the example embodiments of inventive concepts are not limited to the specific shape illustrated in the example views, but may include other shapes that may be created according to manufacturing processes. Areas illustrated in the drawings have general properties, and are used to illustrate specific shapes of elements. Thus, this should not be construed as limited to the scope of the example embodiments.

It will be also understood that although the terms first, second, third etc. may be used herein to describe various elements, these elements should not be limited by these terms. These tends are only used to distinguish one element from another element. Thus, a first element in some example embodiments could be termed a second element in other example embodiments without departing from the teachings of the present invention. Example embodiments explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, a method of forming fine patterns according to some example embodiments of inventive concepts will be described in more detail with reference to FIGS. 1 to 10.

Fine patterns in a semiconductor device may be arranged in various forms. If the fine patterns are arranged in square form, a distance between the fine patterns may limit the widths of the fine patterns in a limited area. Alternatively, if the fine patterns are arranged in zigzag form or honeycomb form, a distance between the fine patterns may be greater than a distance between the fine patterns arranged in the square form. Thus, it is possible to increase the widths (or diameters) of the fine patterns arranged in the honeycomb form compared to the widths (or diameters) of the fine patterns arranged in the square form.

A mask pattern including line and space patterns diagonally crossing each other may be used to form the fine patterns arranged in the honeycomb form. However, if the line and space patterns diagonally cross each other, an etched region is defined as a diamond shape, such that etching properties may be deteriorated.

Meanwhile, some example embodiments of inventive concepts illustrate methods of forming fine patterns in the zigzag (or honeycomb) form by using line and space patterns perpendicularly crossing each other.

FIGS. 1 to 10 are perspective views illustrating a method of forming fine patterns according to some example embodiments of inventive concepts.

Referring to FIG. 1, a lower layer 20 and a first hard mask layer 40 may be sequentially stacked on a substrate 10. First mask patterns 50 may be formed on the first hard mask layer 40. Additionally, in some example embodiments, a buffer mask layer 30 may further be formed between the lower layer 20 and the first hard mask layer 40. The buffer mask layer 30 may include a buffer organic layer 31 and a buffer capping layer 33 on the buffer organic layer 31.

In some example embodiments, the lower layer 20 may be formed of one of a semiconductor material, a conductive material, an insulating material, and any combination thereof. For example, if the lower layer 20 is formed of the semiconductor material, the lower layer 20 may be a portion of the substrate 10 or an epitaxial layer. For example, if the lower layer 20 is formed of the conductive material, the lower layer 20 may be formed of one of a poly-silicon doped with dopants, a metal silicide, a metal, a metal nitride, or any combination thereof. If the lower layer 20 is formed of the insulating material, the lower layer 20 may be formed of at least one of silicon oxide, silicon nitride, silicon oxynitride, and a low-k dielectric material having a low dielectric constant.

The lower layer 20 may be a single layer or a stack layer including a plurality of layers sequentially stacked. For example, the lower layer 20 may include a plurality of insulating layers sequentially stacked. Additionally, the lower layer 20 may further include at least one conductive layer or semiconductor layer disposed between the stacked insulating layers. In some example embodiments, the lower layer 20 may include at least one of a semiconductor pattern, a conductive pattern, and an insulating pattern.

The first hard mask layer 40 may be formed of a material having an etch selectivity with respect to the lower layer 20. In some example embodiments, the first hard mask layer 40 may be formed of a material having an etch selectivity with respect to the buffer capping layer 33. In other example embodiments, if the first hard mask layer 40 is formed directly on the lower layer 20, the first hard mask layer 40 may be formed of a material having an etch selectivity with respect to the lower layer 20. For example, the first hard mask layer 40 may be formed of at least one selected from silicon-containing materials such as poly-silicon, SiON, $Si_3N_4$, SiCN, and SiC.

In some example embodiments, the buffer mask layer 30 between the lower layer 20 and the first hard mask layer 40 may provide a flat surface on which the first mask patterns 50 are formed. Additionally, the buffer layer 30 may be used as an etch mask material for patterning the lower layer 20.

For example, the buffer organic layer 31 of the buffer mask layer 30 may be formed using a spin-on-coating method. Thus, roughness of a top surface of the buffer organic layer 31 may be small. Additionally, the buffer organic layer 31 may be formed of a material having an etch selectivity with respect to the lower layer 20. The buffer organic layer 31 may be formed of a material of which a main ingredient is carbon. For example, the buffer organic layer 31 may be formed of a layer consisting of carbon and hydrogen, or a layer consisting of carbon, hydrogen, and oxygen. A carbon content of the buffer organic layer 31 may be within a range of about 80 wt % to about 99 wt %. In some example embodiments, the buffer organic layer 31 may be formed of APF (a name of a product of AMAT, so-called 'ACL'), SiLK (a name of a product of Dow Chemical company), NCP (a name of a product of ASM), AHM (a name of a product of Novellous), or a C-SOH layer.

The buffer capping layer 33 of the buffer mask layer 30 may be formed of a material having an etch selectivity with respect to the buffer organic layer 31. For example, an etch ratio of the lower layer 20 versus the buffer capping layer 33 may be about 10:1 or more. Thus, an etch rate of the lower layer 20 may be greater than an etch rate of the buffer capping layer 33 in a process etching the lower layer 20. As a result, it is possible to prevent mask patterns from being damaged before the process etching the lower layer 20 is finished. In some example embodiments, the buffer capping layer 33 may be formed of at least one selected from silicon-containing materials such as SiON, $SiO_2$, $Si_3N_4$, SiCN, SiC, and poly-silicon. A thickness of the buffer capping layer 33 may be changed depending on a thickness of the first mask patterns 50 formed on the buffer capping layer 33.

In some example embodiments, the first mask patterns 50 on the first hard mask layer 40 may be line and space patterns. The first mask patterns 50 may extend in a first direction (i.e., a y-axis direction). The first mask patterns 50 may be repeatedly arranged on the first hard mask layer 40 with a first pitch P1. The first pitch P1 of the first mask patterns 50 may be controlled to change diameters (or widths) of desired fine patterns. The first pitch P1 may be about two times greater than a width W1 of the first mask pattern 50. In other words, the width W1 of the first mask pattern 50 may be substantially the same as a space S1 between the first mask patterns 50. Alternatively, the first mask patterns 50 may be repeatedly arranged with the first pitch P1 and the width W1 of the first mask pattern 50 e greater or less than the space S1 between the first mask patterns 50.

In some example embodiments, the first mask pattern 50 may include a first organic layer 51, a first capping pattern 53, a first anti-reflection pattern 55, and a first photoresist pattern 57, which are sequentially stacked. Forming the first mask patterns 50 may include sequentially stacking a first organic layer, a first capping layer, a first anti-reflection layer, and a first photoresist layer; performing a first photolithography process for forming line and space patterns to form the first photoresist patterns 57; and successively etching the first reflection layer, a first capping layer, and a first organic layer using the first photoresist patterns 57 as etch masks. The first organic pattern 51 may be formed of a material of which a main ingredient is carbon, and the first organic pattern 51 may be formed using a spin-on-coating method, similar to the buffer organic layer 31. Like the buffer capping layer 33, the first capping pattern 53 may be formed of a material having an excellent etch selectivity with respect to an etch target layer (i.e., the first hard mask layer 40). For example, the first capping pattern 53 may be formed of at least one selected from silicon-containing materials such as SiON, $SiO_2$, $Si_3N_4$, SiCN, SiC, and poly-silicon. The first anti-reflection pattern 55 may be formed of a material that absorbs light to prevent light reflection during an exposure process. Additionally, the first anti-reflection pattern 55 may be formed of an organic material having an etching property similar to that of the first photoresist patterns 57.

Figure 2:
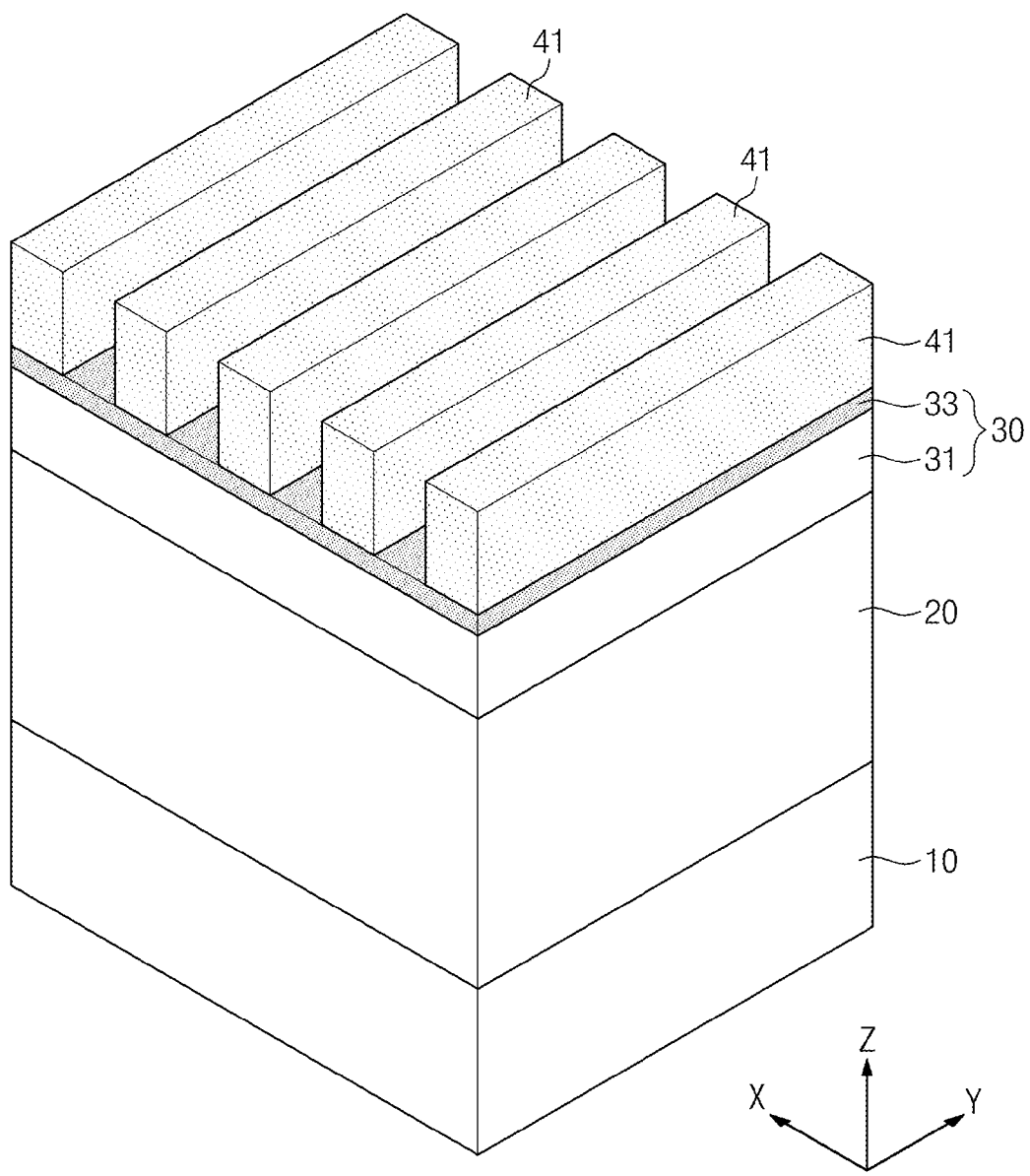

Referring to FIG. 2, the first hard mask layer 40 is anisotropically etched using the first mask patterns 50 as etch masks. Thus, first hard mask patterns 41 having line-shapes may be formed on the buffer mask layer 30. When the first hard mask layer 40 is anisotropically etched, the buffer mask layer 30 may be used as an etch stop layer.

In some example embodiments, since the first hard mask patterns 41 are formed using the first mask patterns 50 as etch masks, the first hard mask patterns 41 may be repeatedly arranged with the first pitch P1. The first pitch P1 may be about two times greater than a width W1 of the first hard mask pattern 41. In the method of forming fine patterns according to some example embodiments, the diameters of the fine patterns may be determined depending on the widths and spaces of the first hard mask patterns 41.

After the first hard mask patterns 41 are formed, the first mask patterns 50 may be removed using an ashing process and a strip process.

Figure 3:
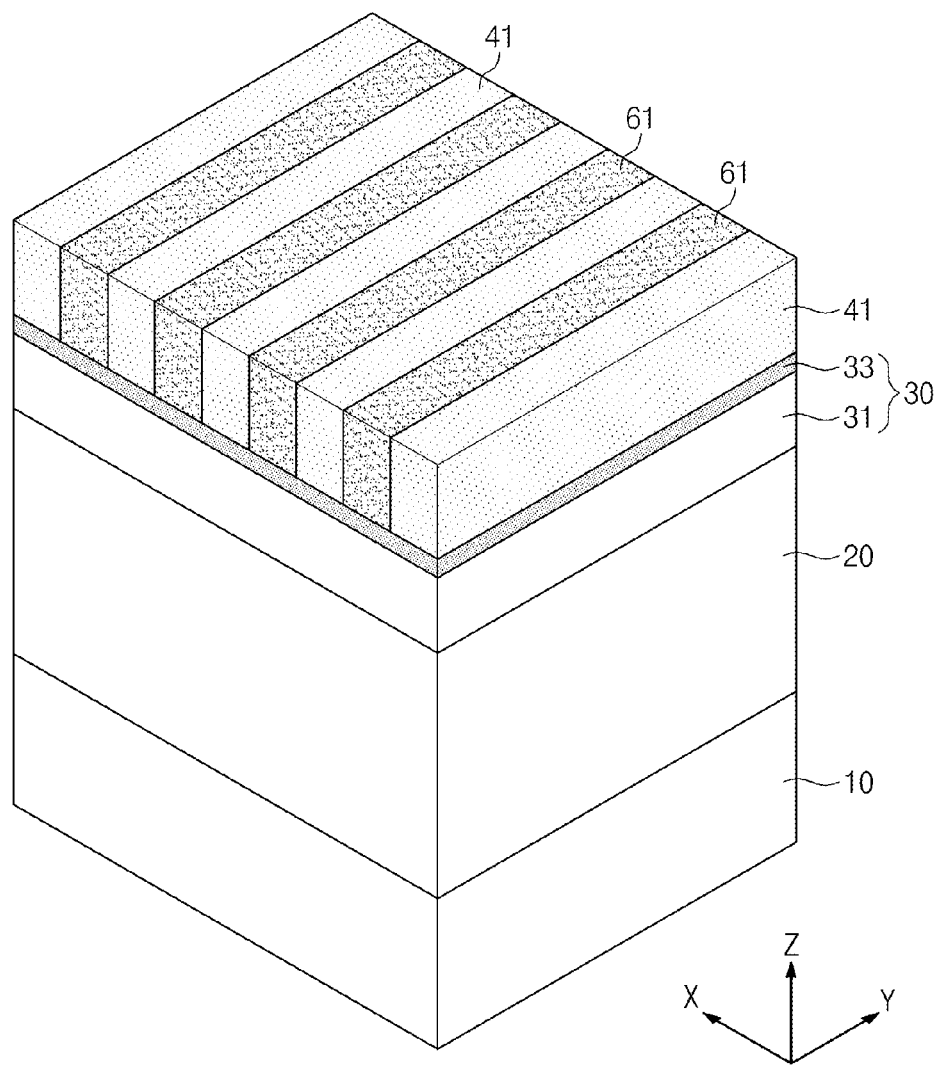

Referring to FIG. 3, second hard mask patterns 61 may be formed to fill gap regions between the first hard mask patterns 41.

In some example embodiments, forming the second hard mask patterns 61 may include depositing a second hard mask layer filling the gap regions between the first hard mask patterns 41 and planarizing the second hard mask layer until top surfaces of the first hard mask patterns 41 are exposed.

Since the second hard mask patterns 61 fill the gap regions between the first hard mask patterns 41, the second hard mask patterns 61 may also be repeatedly arranged with the first pitch P1 of the first hard mask patterns 41. The second hard mask patterns 61 may be formed of a material having an etch selectivity with respect to the buffer mask layer 30 and the first hard mask patterns 41. For example, the second hard mask patterns 61 may be formed of at least one selected from silicon-containing materials such as SiON, $Si_3N_4$, SiCN, SiC, and poly-silicon. The second hard mask patterns 61 are formed of a material different from that of first hard mask patterns 41.

Figure 4:
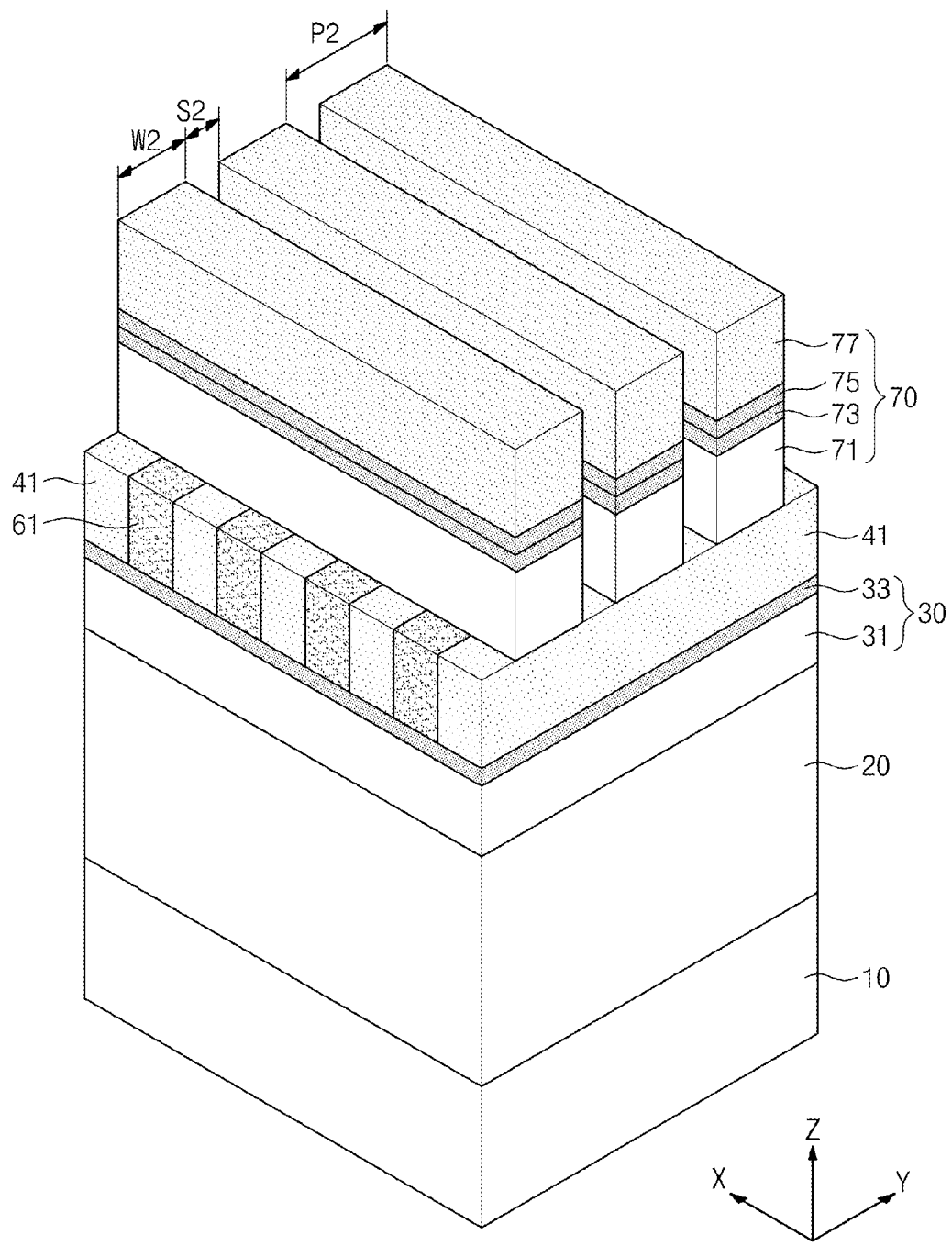

Referring to FIG. 4, second mask patterns 70 are formed on the first and second hard mask patterns 41 and 61. The second mask patterns 70 may be line and space patterns. The second mask patterns 70 may perpendicularly cross over the first and second hard mask patterns 41 and 61 in a plan view. In other words, the second mask patterns 70 may extend in a second direction (i.e., an x-axis direction) perpendicular to the first direction. Thus, top surfaces of the first and second hard mask patterns 41 and 61 may be locally exposed by the second mask patterns 70.

In some example embodiments, the second mask patterns 70 may be repeatedly arranged with a second pitch P2. The second pitch P2 may be about two or more times greater than the first pitch P1 of the first hard mask patterns 41. The second pitch P2 may be controlled so that a space in the y-axis direction between first openings 65 formed in a subsequent process may be controlled and a space between the fine patterns may be changed. Additionally, the diameter of the fine pattern may be changed depending on a space S2 between the second mask patterns 70. In some example embodiments, a width W2 of the second mask pattern 70 may be greater than the width W1 of the first hard mask pattern 41. For example, the width W2 of the second mask pattern 70 may be about two or more times greater than the width W1 of the first mask pattern 50. The space S2 between the second mask patterns 70 may be substantially equal to or greater than the space S1 between the first hard mask patterns 41 (or the width between the second hard mask patterns 61).

In some example embodiments, each of the second mask patterns 70 may include a second organic pattern 71, a second capping pattern 73, a second anti-reflection pattern 75, and a second photoresist pattern 77, which are sequentially stacked, similarly to the first mask pattern 50.

For example, forming the second mask patterns 70 may include sequentially stacking a second organic layer, a second capping layer, a second anti-reflection layer, and a second photoresist layer; performing a second photolithography process for forming line and space patterns to form second photoresist patterns 77; and successively etching the second reflection layer, a second capping layer, and a second organic layer using the second photoresist patterns 77 as etch masks. The second organic layer may be formed of a material of which a main ingredient is carbon, and the second organic layer may be formed using a spin-on-coating method. The second capping layer may be formed of a material having an excellent etch selectivity with respect to an etch target layer (i.e., the first and second hard mask patterns 41 and 61). For example, the second capping layer may be formed of at least one selected from silicon-containing materials such as SiON, $SiO_2$, $Si_3N_4$, SiCN, SiC, and poly-silicon. The second anti-reflection layer may be formed of a material that absorbs light to prevent light reflection during an exposure process. Additionally, the second anti-reflection layer may be formed of an organic material having an etching property similar to that of the second photoresist patterns 77.

Figure 5:
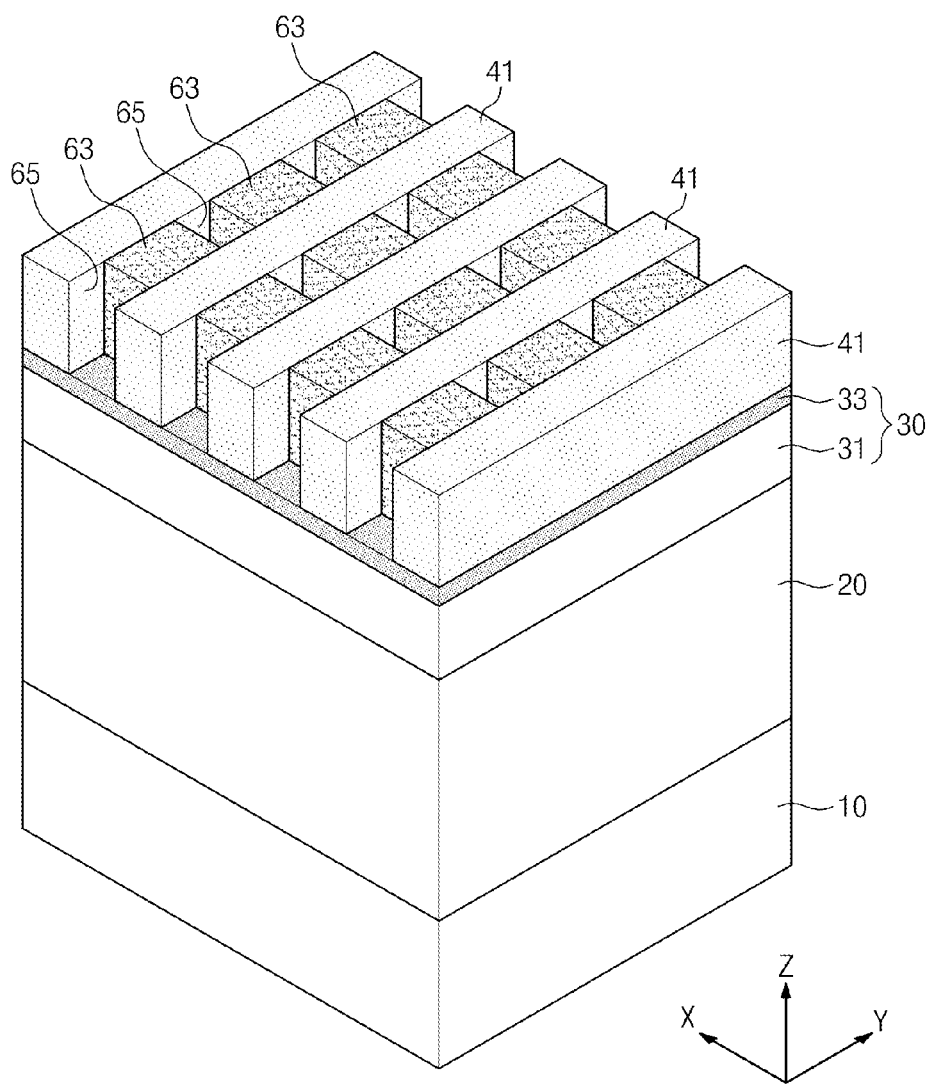

The second hard mask patterns 61 may be selectively etched using the second mask patterns 70 as etch masks. Thus, first openings 65 locally exposing the buffer mask layer 30 may be formed in the second hard mask patterns 61, as illustrated in FIG. 5. Since the first hard mask patterns 41 are formed of the material having an etch selectivity with respect to the second hard mask patterns 61, the first hard mask patterns 41 may be used as etch masks in conjunction with the second mask patterns 70 when the first openings 65 are formed. Thus, the first openings 65 may expose portions of sidewalls of the first hard mask patterns 41.

The openings 65 may be two-dimensionally arranged in the first direction (i.e., the y-axis direction) and the second direction (i.e., the x-axis direction). The first openings 65 arranged along the first direction may be disposed at equal intervals, and the first openings 65 arranged along the second direction may be disposed at equal intervals. A space between the first openings 65 arranged in the first direction may be greater than a space between the first openings 65 arranged in the second direction. The space between the first openings 65 in the first direction may be defined by the width of the second mask pattern 70.

After the first openings 65 are formed, the second mask patterns 70 may be removed by an aching process and/or a strip process.

Figure 6:
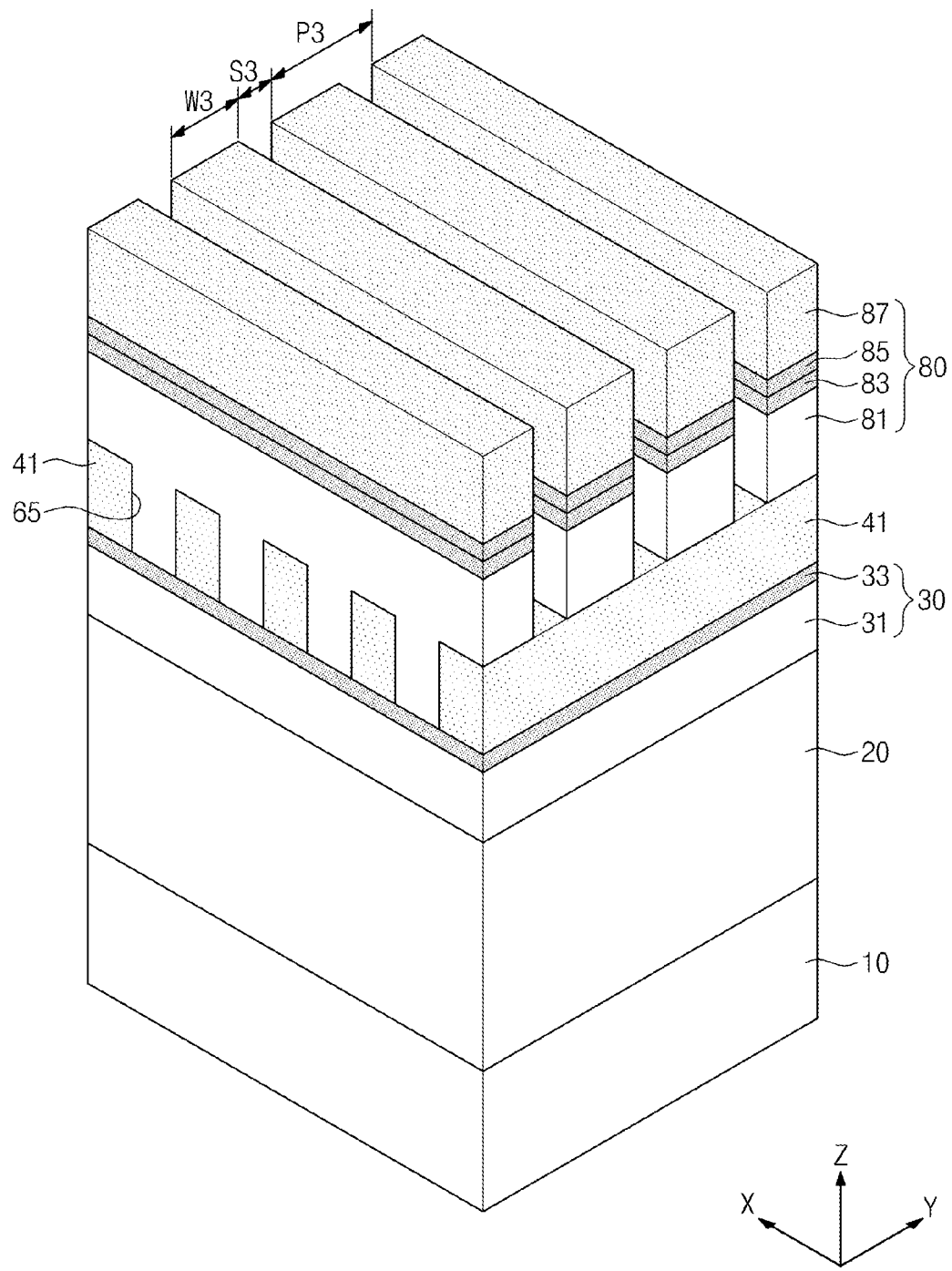

Referring to FIG. 6, after the first openings 65 are formed, third mask patterns 80 are formed on the first and second hard mask patterns 41 and 61.

In some example embodiments, the third mask patterns 80 may have a line and space-shape and perpendicularly cross over the first and second hard mask patterns 41 and 61 in a plan view. In other words, the third mask patterns 80 may extend in the first direction (i.e., the y-axis direction). The third mask patterns 80 fill the first openings 65 and cross over the first hard mask patterns 41. Since the third mask patterns 80 are formed, the top surfaces of the first and second mask patterns 41 and 61 may be locally exposed.

In some example embodiments, the third mask patterns 80 may be moved a desired distance from positions of the second mask patterns 70 so that the first and second hard mask patterns 41 and 61 between the first openings 65 are exposed.

For example, the third mask patterns 80 may be repeatedly arranged with a third pitch P3. The third pitch P3 may be two or more times greater than the first pitch P1 of the first hard mask patterns 41. The third pitch P3 of the third mask patterns 80 may be controlled to control a space between second openings 45 of FIG. 7 arranged in the y-axis direction and to change a space between fine patterns. Additionally, a width W3 of the third mask pattern 80 may be greater than the width W1 of the first hard mask pattern 41. For example, the width W3 of the third mask pattern 80 may be two or more times greater than the width W1 of the first hard mask pattern 41. A space S3 between the third mask patterns 80 may be equal to or greater than the space S1 of the first hard mask patterns 41 (i.e., the width of the second hard mask pattern 61).

In some example embodiments, the third mask pattern 80 may include a third organic pattern 81, a third capping pattern 83, a third anti-reflection pattern 85, and a third photoresist pattern 87 sequentially stacked, similar to the second mask pattern 70. Forming the third mask patterns 80 may include sequentially stacking a third organic layer, a third capping layer, a third anti-reflection layer, and a third photoresist layer; performing a third photolithography process for forming line and space patterns to form the third photoresist patterns 87; and successively etching the third anti-reflection layer, the third capping layer, and a third organic layer using the third photoresist patterns 87 as etch masks. The third organic layer may be formed of a material of which a main ingredient is carbon. The third organic layer may be formed using a deposition method or a spin-on-coating method. Since the third organic layer is formed by the deposition method or the spin-on-coating method, the third organic layer may fill the first openings 65 and have a flat surface.

Figure 7:
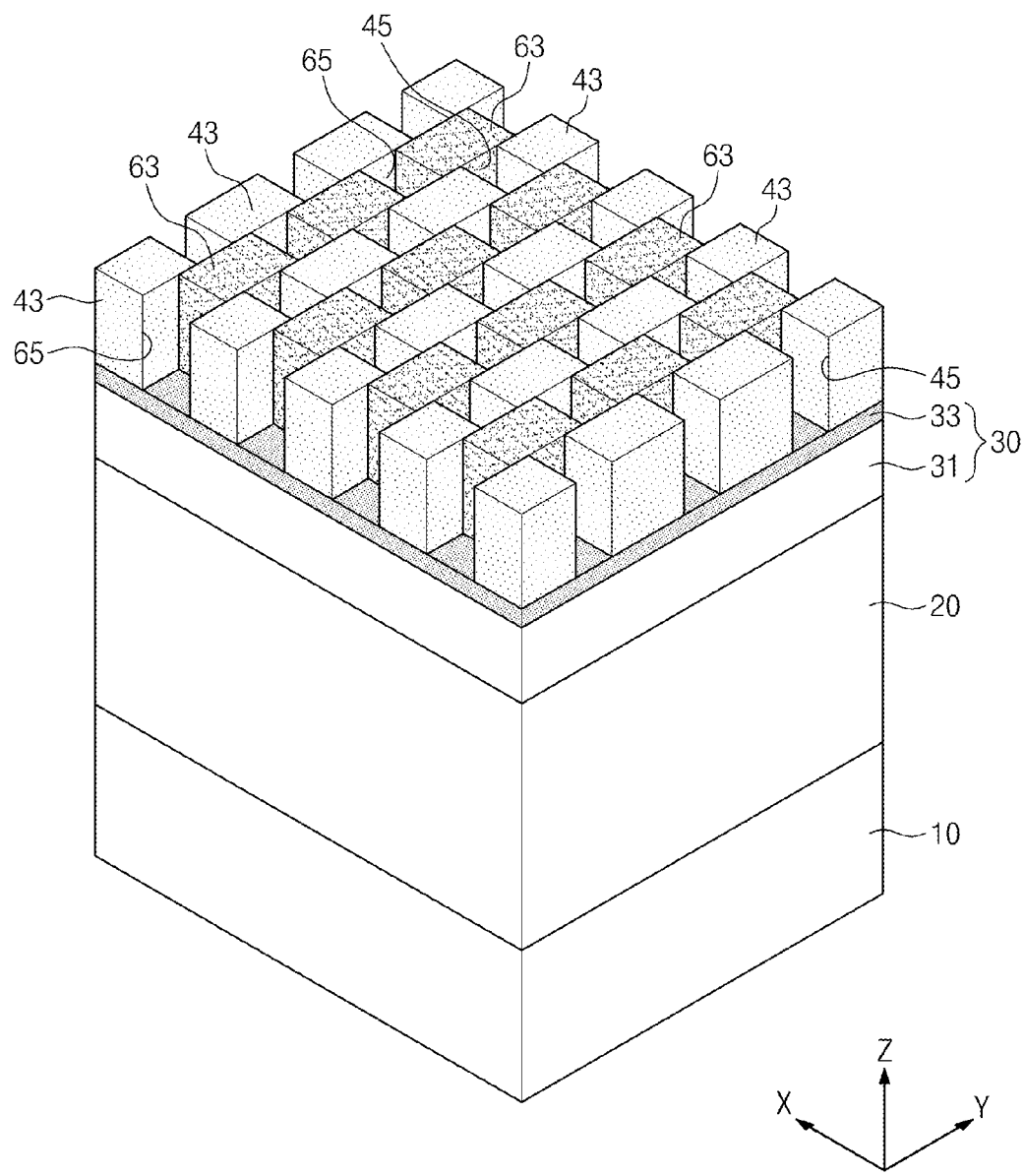

The first hard mask patterns 41 are etched using the third mask patterns 80 as etch masks. Thus, the second openings 45 may be formed in the first hard mask patterns 41 as illustrated in FIG. 7. Since the second hard mask patterns 61 are formed of the material having an etch selectivity with respect to the first hard mask patterns 41, the second hard mask patterns 61 may be used as etch masks in conjunction with the third mask patterns 80 when the second openings 45 are formed.

After the second openings 45 are formed, the third mask patterns 80 may be removed using an ashing process and/or a strip process. Thus, the first and second hard mask patterns 41 and 61 in which the first and second openings 65 and 45 are formed may be formed on the buffer mask layer 30 as illustrated in FIG. 7.

For example, the second openings 45 may be two-dimensionally arranged in the first direction and the second direction. The second openings 45 arranged along the first direction may be disposed at equal intervals, and the second openings 65 arranged along the second direction may be disposed at equal intervals. The second openings 45 may be spaced apart from the first openings 65 in a diagonal direction with respect to the first and second directions. In other words, the first and second openings 65 and 45 may be arranged in zigzag form on the buffer mask layer 30. In some example embodiments, a space between the second openings 45 arranged in the first direction (i.e., the y-axis direction) may be greater than a space between the second openings 45 arranged the second direction (i.e., the x-axis direction). The space between the second openings 45 in the first direction may be defined by the width of the third mask pattern 80.

Figure 8:
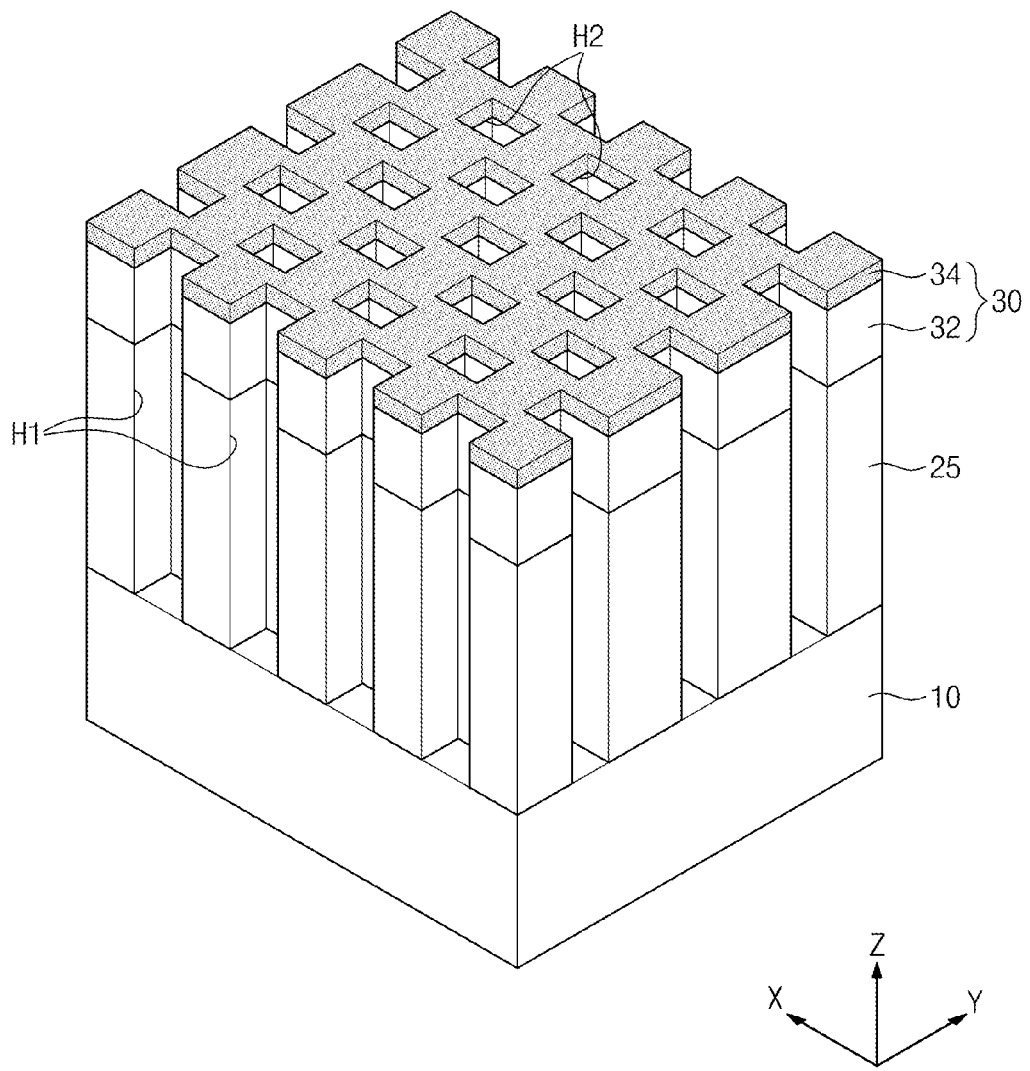

The buffer mask layer 30 may be etched using the first and second hard mask patterns 41 and 61 defining the first and second openings 65 and 45 as etch masks. Thus, the first and second openings 65 and 45 may be transferred to the buffer mask layer 30, so that buffer mask pattern 30 having first and second holes H1 and H2 may be formed as illustrated in FIG. 8. The buffer mask pattern 30 may include the buffer organic layer 31 of a single material and the buffer capping layer 33 of a single material, and each of the first and second holes H1 and H2 may successively penetrate the buffer capping layer 33 and the buffer organic layer 31. The first and second holes H1 and H2 may be arranged in zigzag form in a plan view.

Figure 9:
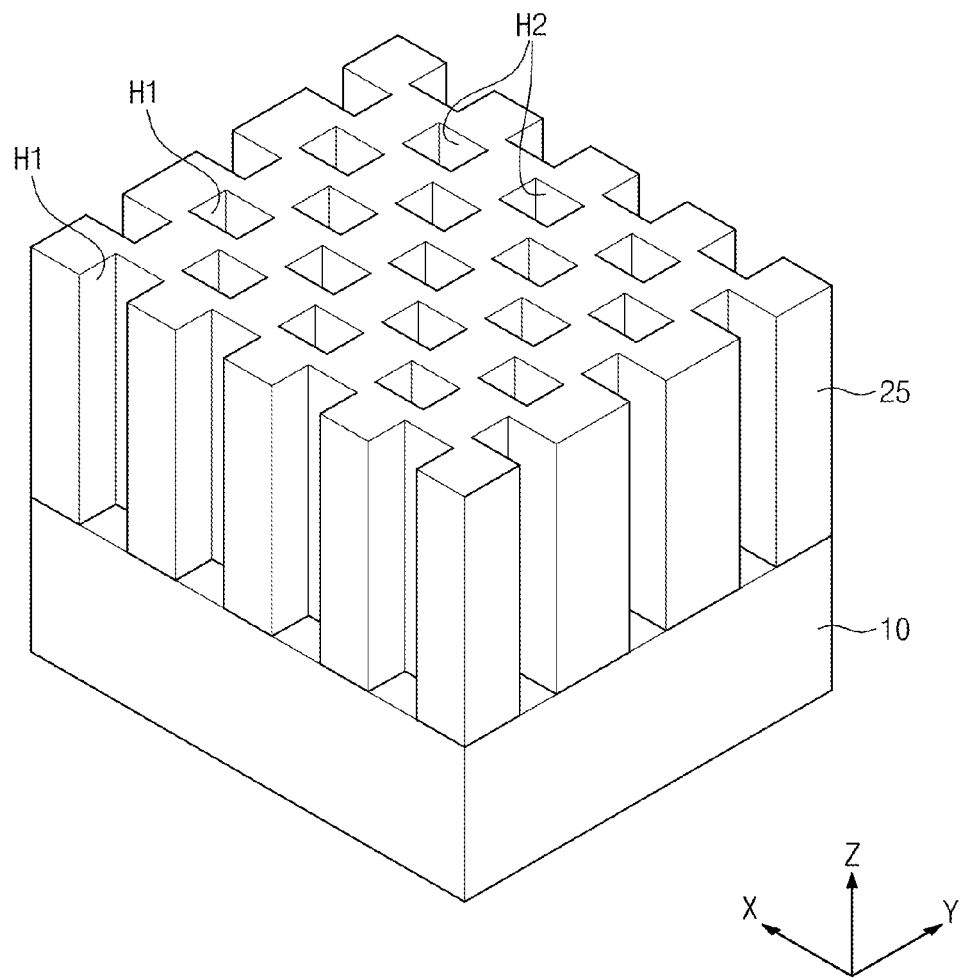

The lower layer 20 may be continuously etched using the buffer mask pattern 30 as an etch mask to form a lower pattern 25, as illustrated in FIG. 9. The lower pattern 25 may have first and second holes H1 and H2 to which the first and second openings 65 and 45, defined by the first and second hard mask patterns 41 and 61, are transferred. In other words, each of the first and second holes H1 and H2 may successively penetrate the buffer mask pattern 30 and the lower pattern 25. Thus, the first and second contact holes H1 and H2 in the lower pattern 25 may be arranged in zigzag form when viewed from a plan view. For example, the first and second holes H1 and H2 may be two-dimensionally arranged in the first direction and the second direction. The second holes H2 may be spaced apart from the first holes H1 in a diagonal direction with respect to the first and second directions. A space between the first holes H1 arranged in the first direction (i.e., the y-axis direction) may be greater than a space between the first holes H1 arranged in the second direction (i.e., the x-axis direction). Additionally, distances between the first holes H1 and the second holes H2 adjacent to the first holes H1 may be substantially equal to each other in a plan view. Likewise, distances between the second holes H2 and the first holes H1 adjacent to the second holes H2 may be substantially equal to each other in a plan view.

Figure 10:
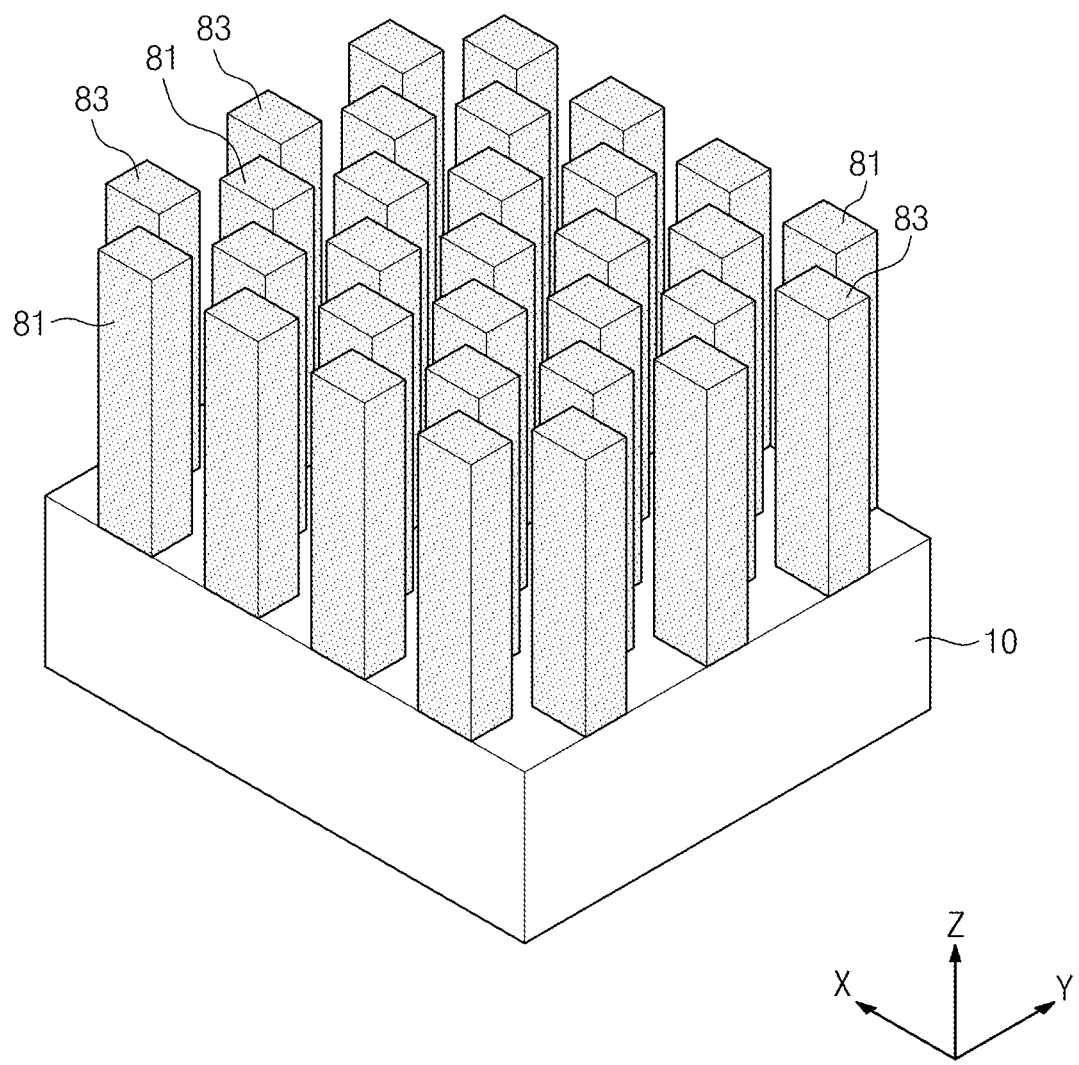

Referring to FIG. 10, a filling layer may be formed on the lower pattern 25 so as to fill the first and second holes H1 and H2. The filling layer may be formed of a material having an etch selectivity with respect to the lower pattern 25. For example, the filling layer may be formed of a conductive material, a semiconductor material, or an insulating material. The filling layer may be planarized until the lower pattern 25 is exposed, such that fine patterns may be formed in the first and second holes H1 and H2.

Subsequently, the lower pattern 25 may be removed, so that the fine patterns 81 and 83 arranged in zigzag form may be formed on the substrate 10. For example, the fine patterns 81 and 83 may include first fine patterns 81 formed in the first holes H1 and second fine patterns 83 formed in the second holes H2.

Like the arrangement of the first and second holes H1 and H2, the first and second fine patterns 81 and 83 may also be arranged in zigzag form. For example, the first fine patterns 81 may be two-dimensionally arranged in the first direction (i.e., the y-axis direction) and the second direction (i.e., the x-axis direction), and the second fine patterns 83 may also be two-dimensionally arranged in the first direction and the second direction. A space between the first fine patterns 81 arranged in the first direction may be greater than a space between the first fine patterns 81 arranged in the second direction. Additionally, a space between the second fine patterns 83 arranged in the first direction may be greater than a space between the second fine patterns 83 arranged in the second direction. The second fine patterns 83 may be spaced apart from the first fine patterns 81 in a diagonal direction with respect to the first and second directions in a plan view. Distances between a center of the first fine patterns 81 and centers of the second fine patterns 83 adjacent to the first fine patterns 81 may be substantially equal to each other. Likewise, distances between a center of the second fine patterns 83 and centers of the first fine patterns 81 adjacent to the second fine patterns 83 may be substantially equal to each other.

A method of manufacturing a semiconductor device using the method of forming the fine patterns according to example embodiments will be described hereinafter. The above semiconductor device may include at least one of highly integrated semiconductor memory devices (e.g., a dynamic random access memory (DRAM), a static random access memory (SRAM), a phase change random access memory (PRAM), a resistance random access memory (RRAM), a ferroelectric random access memory (FRAM), and a flash memory), micro electro mechanical system (MEMS) devices, optoelectronic devices, and processors (e.g., a central processing unit (CPU) and a digital signal processor (DSP)). The semiconductor device may consist of the same kind of devices. Alternatively, the semiconductor device may be a single-chip data processing device such as a system on chip (SOC) consisting of different kinds of devices necessary to perform one complete function.

Figure 11:
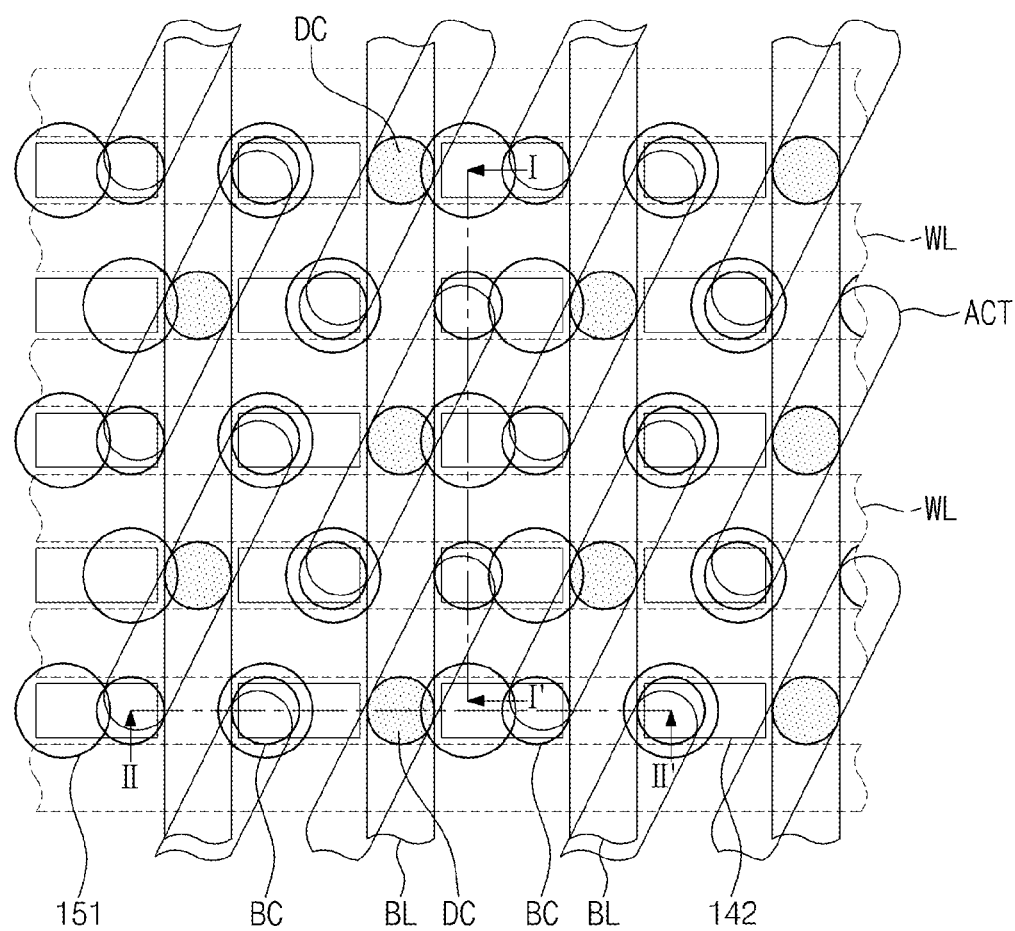
FIG. 11 is a plan view illustrating a semiconductor memory device formed using a method for forming fine patterns according to some example embodiments of inventive concepts.
Figure 12:
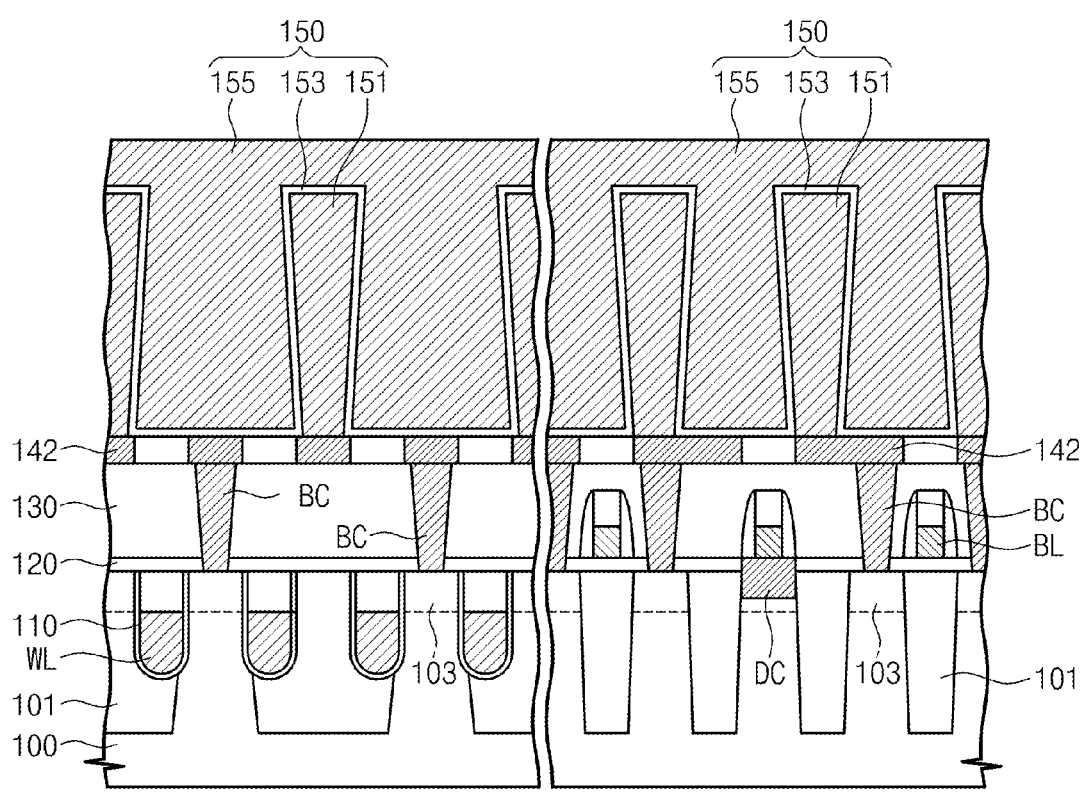
FIG. 12 is a cross-sectional view taken along lines I-I' and II-II' of FIG. 11.

A semiconductor memory device formed using the method of forming the fine patterns according to example embodiments will be described with reference to FIGS. 11 and 12. FIG. 11 is a plan view illustrating a semiconductor memory device formed using a method of forming fine patterns according to some example embodiments of inventive concepts. FIG. 12 is a cross-sectional view taken along lines I-I' and II-II' of FIG. 11.

Referring to FIGS. 11 and 12, a semiconductor memory device may include word lines WL and bit line BL crossing each other, and memory cells respectively disposed crossing regions of the word lines WL and bit lines BL. In some example embodiments, each of the memory cells may include a capacitor 150 including a lower electrode 151, an upper electrode 155, and a dielectric layer 154 therebetween.

For example, a device isolation layer 101 may be formed on a semiconductor substrate 10 to define active regions ACT. Each of the active regions ACT may have a bar-shape in a plan view. A long axis of the active region ACT may extend in a diagonal direction with respect to the word lines WL and the bit lines BL.

The word lines WL may cross the active regions ACT. In some example embodiments, the word lines WL may be respectively formed in recess regions that are recessed from a top surface of the semiconductor substrate 100 by a desired depth. A gate insulating layer 110 may be disposed between each of the word lines WL and an inner surface of each of the recess regions. Top surfaces of the word lines WL may be disposed at a level lower than the top surface of the semiconductor substrate 100, and an insulating material may fill the recess region on the top surface of each of the word lines WL.

Source/drain regions 103 may be formed in the active regions ACT on both sides of each of the word lines WL. The source/drain regions 103 may be dopant regions doped with dopants.

Since the word lines WL and the source/drain regions 103 are formed as described above, a plurality of MOS transistors may be formed on semiconductor substrate 100.

The bit lines BL may be disposed on the semiconductor substrate 100 to cross over the word lines WL. An interlayer insulating layer 120 may be disposed between the bit lines BL and the semiconductor substrate 100, and bit line contact plugs DC may be formed in the interlayer insulating layer 120. The bit line contact plugs DC may electrically connect the source/drain regions 103 to the bit lines BL.

Contact plugs BC electrically connecting data storing elements to the source/drain regions 103 may be formed in an upper interlayer insulating layer 130 covering the bit lines BL. In some example embodiments, the contact plugs BC may be disposed on the active region ACT on both sides of the bit line BL.

Contact holes exposing the source/drain regions 103 may be formed in the upper interlayer insulating layer 130, a conductive layer filling the contact holes may be deposited on the upper interlayer insulating layer 130, and the conductive layer may be planarized to form the contact plugs BC. The contact plugs BC may be formed of at least one of a poly-silicon doped with dopants, a metal, a metal nitride, metal silicide, and any combination thereof.

In some example embodiments, contact pads 142 may be formed on the contact plugs BC. The contact pads 142 may be two-dimensionally arranged on the upper interlayer insulating layer 130. The contact pad 142 may increase a contact area between the lower electrode 151 on the contact pad 142 and the contact plug BC under the contact pad 142. For example, two neighboring contact plugs 142 disposed on both sides of the bit line BL in a plan view may be enlarged in opposite directions, respectively.

The lower electrode 151 may be formed on each of the contact pads 142. In some example embodiments, the lower electrodes 151 may be formed by the method of forming fine patterns that is described with reference to FIGS. 1 to 10. For example, the lower pattern 25 described with reference to FIG. 9 may be formed on the contact pads 142, a conductive material may fill each of the first and second holes H1 and H2 arranged in zigzag form, and then the lower pattern 25 of FIG. 9 may be removed to form the lower electrodes 151. In other words, the lower electrodes 151 arranged in zigzag form may be formed on the upper interlayer insulating layer 130. For example, the lower electrodes 151 may be disposed along a diagonal direction with respect to the word lines WL and the bit lines BL.

After the lower electrodes 151 are formed, the dielectric layer 153 may be formed to conformally cover surfaces of the lower electrodes 151. The upper electrode 155 may be formed on the dielectric layer 153.

Figure 13:
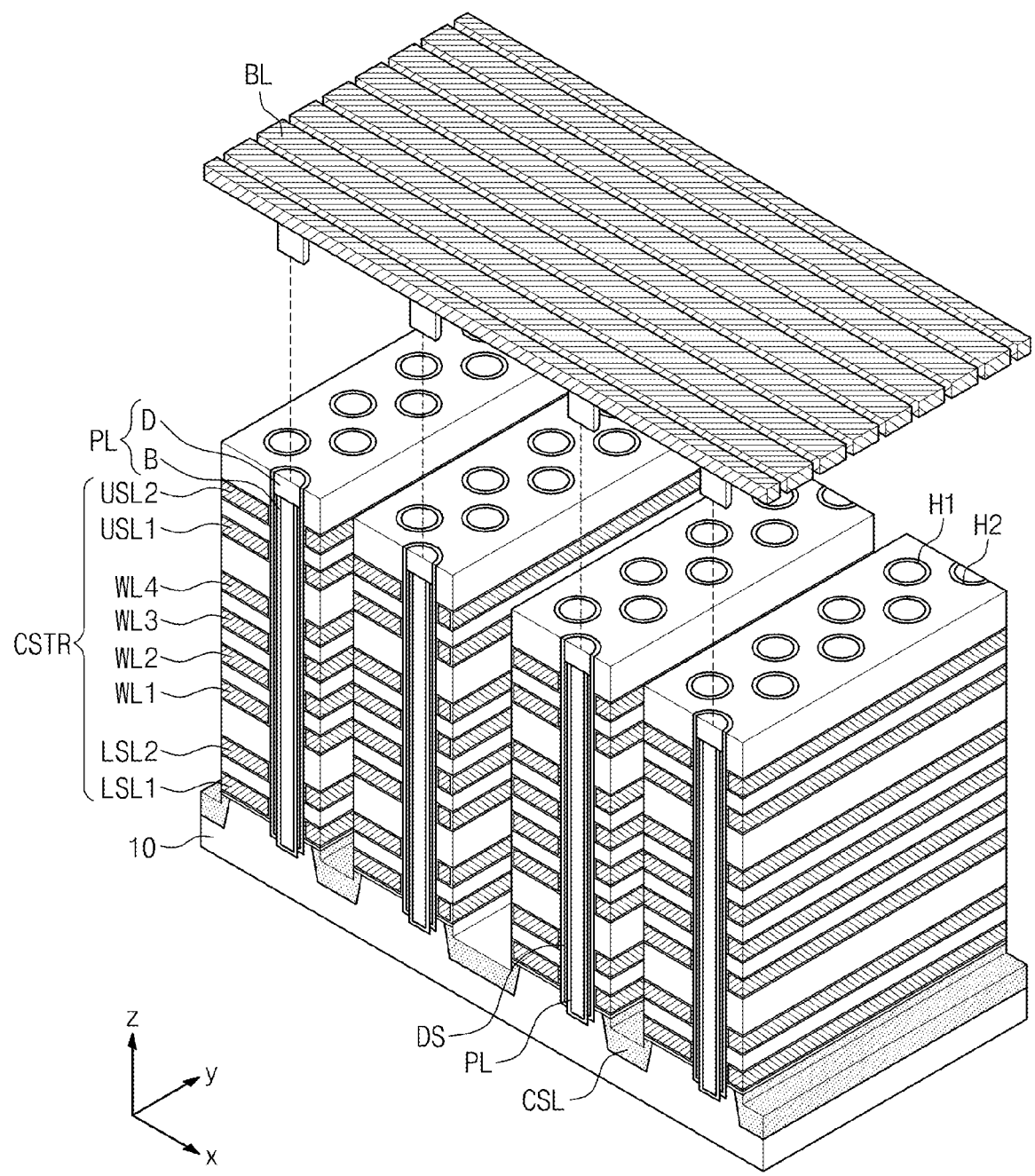
FIG. 13 is a perspective view illustrating a three-dimensional (3D) semiconductor memory device formed using a method of foaming fine patterns according to some example embodiments of inventive concepts.

FIG. 13 is a perspective view illustrating a three-dimensional (3D) semiconductor memory device formed using a method of foaming fine patterns according to some example embodiments of inventive concepts.

Referring to FIG. 13, a 3D semiconductor memory device according to some example embodiments may include a common source line CSL, a plurality of bit lines BL, and a plurality of cell strings CSTR disposed between the common source line CSL and the bit lines BL.

The common source line CSL may be a conductive layer disposed on a substrate 10 or a dopant region formed in the substrate 10. The bit lines BL may be conductive patterns (e.g., metal lines) spaced apart from the substrate 10 and disposed over the substrate 10. The bit lines BL may be two-dimensionally arranged in a plan view. Each of the bit lines BL may be connected in parallel to a plurality of the cell strings CSTR. Thus, the cell strings CSTR may be two-dimensionally arranged on the common source line CSL or the substrate 10 in a plan view.

Each of the cell strings CSTR may include a plurality of lower selection lines LSL1 and LSL2, a plurality of word lines WL0 to WL3, and a plurality of upper selection lines USL1 and USL2 that are disposed between the common source line CSL and the bit lines BL. The lower selection lines LSL1 and LSL2, the word lines WL0 to WL3, and the upper selection lines USL1 and USL2 may be conductive patterns that are sequentially stacked on the substrate 10 with insulating layers therebetween.

Additionally, each of the cell strings CSTR may include a semiconductor pillar PL that vertically extends from the substrate 10 and is connected to the bit line BL. The semiconductor pillars PL may penetrate the lower selection lines LSL1 and LSL2, the word lines WL0 to WL3, and the upper selection lines USL1 and USL2. In other words, the semiconductor pillars PL may penetrate a plurality of conductive patterns that are stacked on the substrate 10. The semiconductor pillar PL may include a body part B and a dopant region formed in one or both end portions. For example, a drain region D may be formed in a top end portion of the semiconductor pillar PL (i.e., between the body part B and the bit line BL).

A data storing layer DS may be disposed between the word lines WL0 to WL3 and the semiconductor pillars PL. In some example embodiments, the data storing layer DS may be a charge storing layer. For example, the data storing layer DS may include at least one of a trap insulating layer, a floating gate electrode, and a conductive nano dots.

A dielectric layer used as a gate insulating layer of a transistor may be disposed between the lower selection lines LSL1 and LSL2 and the semiconductor pillars PL and/or between the upper selection lines USL1 and USL2 and the semiconductor pillars PL. The dielectric layer may be formed of the same material as the data storing layer DS. Alternatively, the dielectric layer may be a gate insulating layer (e.g., a silicon oxide layer) used in a general MOS field effect transistor.

In the structure described above, the semiconductor pillars PL, the lower selection lines LSL1 and LSL2, the word lines WL0 to WL3, and the upper selection lines USL1 and USL2 may constitute MOS field effect transistors using the semiconductor pillars PL as channel regions. Alternatively, the semiconductor pillars PL, the lower selection lines LSL1 and LSL2, the word lines WL0 to WL3, and the upper selection lines USL1 and USL2 may constitute MOS capacitors. For example, the cell string CSTR may include lower selection transistors including the lower selection lines LSL1 and LSL2, cell transistors including the word lines WL0 to WL3, and upper selection transistors including the upper selection lines USL1 and USL2 that are connected in series to each other and are vertically stacked on the substrate 10.

In the 3D semiconductor memory device including the semiconductor pillars PL, the semiconductor pillars PL may be formed using the method of forming the fine patterns according to example embodiments of inventive concepts.

For example, a stack structure may be formed on the substrate 10. The stack structure may include insulating layers and conductive layers that are alternately and repeated stacked. The conductive layers may include the lower selection lines LSL1 and LSL2, the word lines WL0 to WL3, and the upper selection lines USL1 and USL2. The stack structure may correspond to the lower layer 20 described with reference to FIGS. 1 to 10. The method described with reference to FIGS. 1 to 10 may be performed to form the first and second holes H1 and H2 arranged in zigzag form in the stack structure. The data storing layer DS and the semiconductor pillars PL may be formed in the first and second holes H1 and H2. In other example embodiments, the stack structure may include insulating layers and sacrificial layers that are alternately and repeatedly stacked. In this case, after the holes H1 and H2, the data storing layer DS, and the semiconductor pillars PL are formed using the method described with reference to FIGS. 1 to 10, a replacement process may be performed to replace the sacrificial layers with the lower selection lines LSL1 and LSL2, the word lines WL0 to WL3, and the upper selection lines USL1 and USL2.

Figure 14:
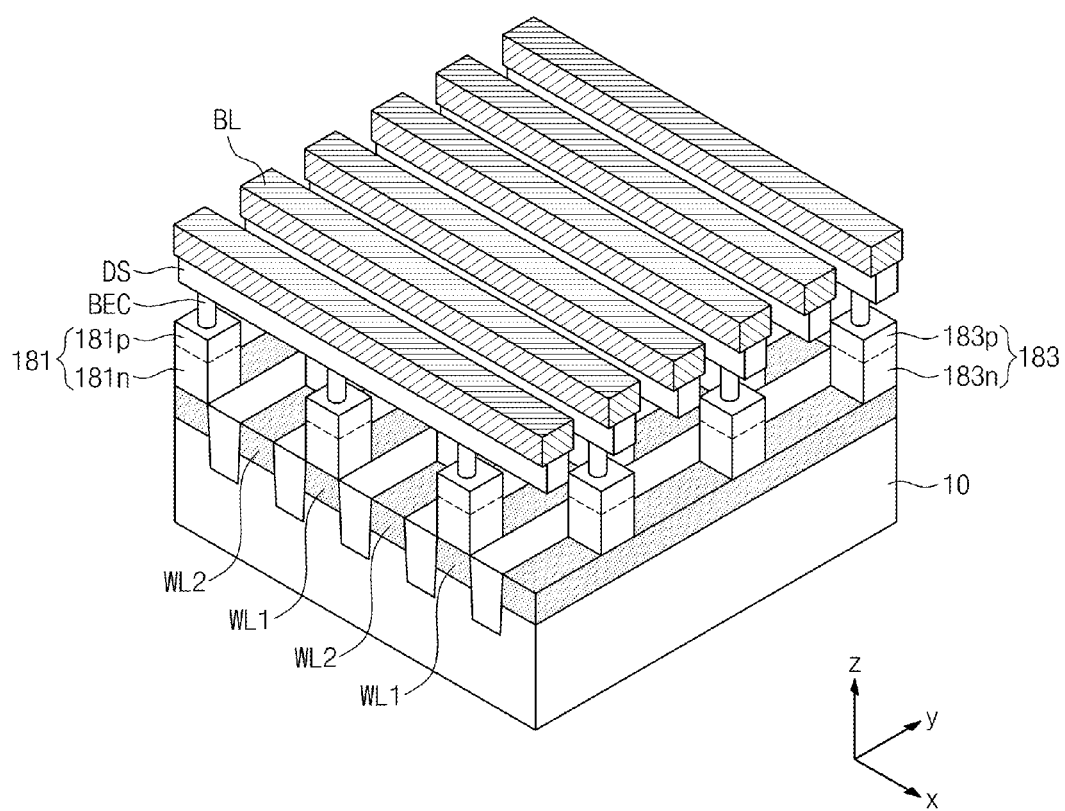
FIG. 14 is a perspective view illustrating a variable resistance memory device formed using a method of forming fine patterns according to some example embodiments of inventive concepts.

FIG. 14 is a perspective view illustrating a variable resistance memory device formed using a method of forming fine patterns according to some example embodiments of inventive concepts.

Referring to FIG. 14, a semiconductor memory device may include a semiconductor substrate 10, a lower interconnections WL1 and WL2 on the substrate 10, upper interconnections BL crossing over the lower interconnections WL1 and WL2, selection elements respectively disposed in crossing regions of the lower interconnections WL1 and WL2 and the upper interconnections BL, and a memory element DS disposed between each of the selection elements and each of the upper interconnections BL. The selection elements may be two-dimensionally arranged on the semiconductor substrate 10 and may control a flow of a current passing through the memory element DS.

For example, the lower interconnections WL1 and WL2 may extend parallel to each other in a y-axis direction. In some example embodiments, the lower interconnections WL1 and WL2 may be dopant regions formed by highly doping the portions of semiconductor substrate 10 with dopants. The lower interconnections WL1 and WL2 may have a conductivity type different from that of the semiconductor substrate 10.

In the present example embodiment, the selection elements may include semiconductor patterns 181 and 183 formed by the method of forming the fine patterns described with reference to FIGS. 1 to 10. Each of the first and second holes H1 and H2 in the lower pattern 25 of FIG. 9 may be filled with a semiconductor material and the lower pattern 25 may be removed to form the semiconductor patterns 181 and 183. Thus, the semiconductor patterns 181 and 183 may be arranged in zigzag form on the semiconductor substrate 10 in a plan view.

For example, the selection elements may include first semiconductor patterns 181 disposed on odd-numbered lower interconnections WL1 and second semiconductor patterns 183 disposed on even-numbered lower interconnections WL2. A pitch of the first semiconductor patterns 181 or a pitch of the second semiconductor patterns 183 in a first direction (i.e., a y-axis direction) may be about two or more times greater than a pitch of the lower interconnections WL1 and WL2. The second semiconductor patterns 183 may be disposed on the even-numbered lower interconnections WL2 and be spaced apart from the first semiconductor patterns 181 in a diagonal direction with respect to the first direction.

Additionally, each of the first and second semiconductor patterns 181 and 183 may include an upper dopant region 181*p* (183*p*) and a lower dopant region 181*n* (183*n*). The upper dopant region 181*p* (183*p*) and the lower dopant region 181*n* (183*n*) may have conductivity types different from each other, respectively. For example, the lower dopant region 181*n* (183*n*) may have the same conductivity type as the lower interconnections WL1 and WL2, and the upper dopant region 181*p* (183*p*) may have a conductivity type opposite to that of the lower dopant region 181*n* (183*n*). Thus, a PN junction may be formed in each of the first and second semiconductor patterns 181 and 183. Alternatively, an intrinsic region may be disposed between the upper dopant region 181*p* (183*p*) and the lower dopant region 181*n* (183*n*), such that a PIN junction may be formed in each of the first and second semiconductor patterns 181 and 183. On the other hand, a bipolar transistor of a PNP structure or a NPN structure may be realized by the semiconductor substrate 10, the lower interconnection WL1 or WL2, and each of the first and second semiconductor patterns 181 and 183.

Lower electrodes BEC, the memory elements DS, and the upper interconnections BL may be disposed on the first and second semiconductor patterns 181 and 183. The upper interconnections BL may cross over the lower interconnections WL1 and WL2 and be disposed on the memory elements DS so as to be electrically connected to the memory elements DS.

In some example embodiments, each of the memory elements DS may be formed to be substantially parallel to the upper interconnection BL and may be electrically connected to a plurality of lower electrodes BEC. Alternatively, the memory elements DS may be two-dimensionally arranged. For example, each of the memory elements DS may be disposed on each of the first and second semiconductor patterns 181 and 183 in a one-to-one correspondence. The memory element DS may include a variable resistance pattern configured to be switchable between two resistance states by an electric pulse applied to the memory element DS. In some example embodiments, the memory element DS may include a phase-change material of which a crystal state is changed depending on the amount of a current. In other example embodiments, the memory element DS may include perovskite compounds, transition metal oxides, magnetic materials, ferromagnetic materials, or antiferromagnetic materials.

Each of the lower electrodes BEC may be disposed between each of the first and second semiconductor patterns 181 and 183 and one of the memory elements DS. A planar area of the lower electrode BEC may be smaller than a planar area of each of the first and second semiconductor patterns 181 and 183 or a planar area of the memory element DS.

In some example embodiments, the lower electrode BEC may have a pillar-shape. In other example embodiments, the lower electrode BEC may have may be modified to one of various shapes capable of reducing a planar area thereof. For example, the lower electrode BEC may have a three-dimensional structure such as a U-shaped structure, an L-shaped structure, a hollow cylinder structure, a ring structure, or a cup structure.

Additionally, an ohmic layer may be disposed between each of the lower electrodes BEC and each of the first and second semiconductor patterns 181 and 183 for reducing a contact resistance. For example, the ohmic layer may include a metal silicide such as a titanium silicide, a cobalt silicide, a tantalum silicide, and/or a tungsten silicide.

Figure 15:
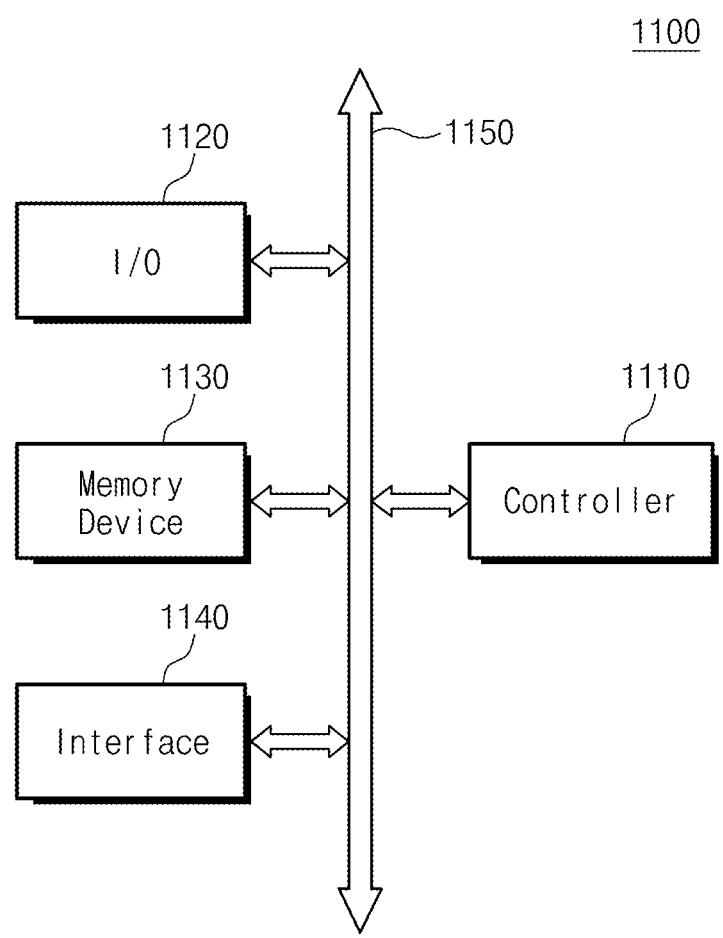
FIG. 15 is a schematic block diagram illustrating an example of electronic systems including the semiconductor devices formed using a method of forming fine patterns according to some example embodiments of inventive concepts.

FIG. 15 is a schematic block diagram illustrating an example of electronic systems including the semiconductor devices formed using a method of forming fine patterns according to some example embodiments of inventive concepts.

Referring to FIG. 15, an electronic system 1100 according to an example embodiment may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices. Other logic devices may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the semiconductor memory devices according to the example embodiments described above. The memory device 1130 may further include at least one of other types of semiconductor memory devices that are different from the semiconductor devices described above. For example, the memory device 1130 may further include a magnetic memory device, a phase change memory device, a dynamic random access memory (DRAM) device and/or a static random access memory (SRAM) device. The interface unit 1140 may transmit electrical data to a communication network or may receive electrical data from a communication network. The interface unit 1140 may operate wirelessly or by cable. For example, the interface unit 1140 may include an antenna for wireless communication or a transceiver for cable communication. Although not shown in the drawings, the electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

According to example embodiments of inventive concepts, the fine pattern arranged in zigzag form may be formed using line and space patterns. Highly integrated semiconductor devices may be formed using the methods of forming the fine patterns according to example embodiments of inventive concepts.

While some example embodiments have been described with reference to the drawings, it will be apparent to those skilled in the art that various changes and modifications may be made without departing from the spirit and scope of the example embodiments. Therefore, it should be understood that the above example embodiments are not limiting, but illustrative. Thus, the scope of the example embodiments of inventive concepts is to be determined by the broadest permissible interpretation of the following claims and their equivalents, and shall not be restricted or limited by the foregoing description.

What is claimed is:

1. A method of forming fine patterns, comprising:
   forming first hard mask patterns extending in a first direction on a lower layer;
   forming second hard mask patterns filling gap regions between the first hard mask patterns;
   forming first mask patterns extending in a second direction perpendicular to the first direction on the first hard mask patterns and the second hard mask patterns;
   etching the first hard mask patterns using the first mask patterns as etch masks to form first openings;
   forming second mask patterns filling the first openings and extending in the second direction; and
   etching the second hard mask patterns using the second mask patterns as etch masks to form second openings spaced apart from the first openings in a diagonal direction with respect to the first direction.

2. The method of claim 1, further comprising:
   transferring the first and second openings to the lower layer to form holes arranged in zigzag form in the lower layer.

3. The method of claim 2, further comprising:
   filling each of the holes in the lower layer with a filling material; and
   removing the lower layer to form fine patterns arranged in zigzag form.

4. The method of claim 1, wherein the first hard mask patterns are repeatedly arranged with a first pitch.

5. The method of claim 4, wherein the first pitch is about two times greater than a width of the first hard mask pattern.

6. The method of claim 5, wherein the first mask patterns are repeatedly arranged with a second pitch that is two or more times greater than the first pitch.

7. The method of claim 6, wherein a width of the first mask pattern is greater than the width of the first hard mask pattern.

8. The method of claim 6, wherein the second mask patterns are repeatedly arranged with a third pitch substantially equal to the second pitch.

9. The method of claim 1, wherein
   the first and second hard mask patterns have an etch selectivity with respect to the lower layer; and
   the first hard mask patterns are formed of a material different from that of the second hard mask patterns.

10. The method of claim 1, wherein the first and second hard mask patterns may include at least one of poly-silicon, SiON, $Si_3N_4$, SiCN, and SiC.

11. The method of claim 1, wherein each of the first and second mask patterns includes an organic pattern including carbon.

12. The method of claim 1, wherein the lower layer is formed of one of a semiconductor material, a conductive material, an insulating material, and any combination thereof.

13. A method of forming fine patterns, comprising:
   forming first hard mask patterns extending in a first direction on a lower layer;
   forming second hard mask patterns filling gap regions between the first hard mask patterns;
   forming first openings in each of the first hard mask patterns, a space between the first openings arranged in the first direction greater than a space between the first openings arranged in a second direction perpendicular to the first direction;
   forming second openings in each of the second hard mask patterns, the second openings spaced apart from the first openings in a diagonal direction with respect to the first direction; and
   transferring the first and second openings to the lower layer to form holes arranged in zigzag form.

14. The method of claim 13, wherein the forming first openings comprises:
   forming first mask patterns extending in the second direction on the first and second hard mask patterns; and
   etching the first hard mask patterns using the first mask patterns and the second hard mask patterns as etch masks.

15. The method of claim 14, wherein the forming second openings comprises:
   removing the first mask patterns after forming the first openings;
   forming second mask patterns that fill the first openings and extend in the second direction; and
   etching the second hard mask patterns using the second mask patterns and the first hard mask patterns as etch masks.

16. A method of forming fine patterns, comprising:
   forming first mask patterns, extending in a first direction, on first hard mask patterns and second hard mask patterns, the first hard mask patterns on a lower layer extending in a second direction perpendicular to the first direction, the second hard mask patterns filling gap regions between the first hard mask patterns;
   etching the first hard mask patterns using the first mask patterns as etch masks to form first openings;
   forming second mask patterns filling the first openings and extending in the first direction; and
   etching the second hard mask patterns using the second mask patterns as etch masks to form second openings spaced apart from the first openings in a diagonal direction with respect to the second direction.

17. The method of claim 16, further comprising:
   transferring the first and second openings to the lower layer to form holes arranged in zigzag form in the lower layer.

18. The method of claim 17, further comprising:
   filling each of the holes in the lower layer with a filling material; and
   removing the lower layer to form fine patterns arranged in zigzag form.

19. The method of claim 16, wherein the first hard mask patterns are repeatedly arranged with a first pitch.

20. The method of claim 19, wherein the first pitch is about two times greater than a width of the first hard mask pattern.

* * * * *